(12) United States Patent
Kato

(10) Patent No.: US 7,469,994 B2
(45) Date of Patent: Dec. 30, 2008

(54) INK-JET HEAD AND CONNECTING STRUCTURE

(75) Inventor: Yasuhiro Kato, Nagoya (JP)

(73) Assignee: Brother Kogyo Kabushiki Kaisha, Nagoya-shi, Aichi-ken (JP)

( * ) Notice: Subject to any disclaimer, the term of this patent is extended or adjusted under 35 U.S.C. 154(b) by 302 days.

(21) Appl. No.: 11/275,789

(22) Filed: Jan. 30, 2006

(65) Prior Publication Data

US 2006/0170738 A1    Aug. 3, 2006

(30) Foreign Application Priority Data

Jan. 31, 2005    (JP) .............................. 2005-022699

(51) Int. Cl.
*B41J 2/14* (2006.01)
*B41J 2/05* (2006.01)

(52) U.S. Cl. .......................................... 347/50; 347/57

(58) Field of Classification Search .................. 347/50, 347/57, 58, 63, 71, 72; 29/890.1
See application file for complete search history.

(56) References Cited

U.S. PATENT DOCUMENTS

| 2004/0060969 A1 | 4/2004 | Imai et al. |
| 2004/0113994 A1 | 6/2004 | Shinkai |

FOREIGN PATENT DOCUMENTS

| JP | H7 156376 | 6/1995 |
| JP | H9 272202 | 10/1997 |
| JP | H10 202876 | 8/1998 |
| JP | 2000 117973 | 4/2000 |
| JP | 2002 36568 | 2/2002 |
| JP | 2004 114609 | 4/2004 |
| JP | 2004 136663 | 5/2004 |

*Primary Examiner*—Shih-Wen Hsieh
(74) *Attorney, Agent, or Firm*—Baker Botts, LLP

(57) ABSTRACT

An ink-jet head has a flexible printed circuit and a head main body, and further has a reinforcement that is located between drive-signal terminals arranged adjacent to one another and a constant-potential-signal terminal. The drive-signal terminals and the constant-potential-signal terminal are formed on a terminal-formed face of an energy applier included in the head main body. The flexible printed circuit has an electrode-formed face on which a constant-potential-signal electrode to be bonded to the constant-potential-signal terminal with a metal bond and drive-signal electrodes to be bonded to the drive-signal terminals with a metal bond. The reinforcement is in contact with and interposed between the terminal-formed face and the electrode-formed face so that the terminal-formed face and the electrode-formed face are spaced apart from each other.

15 Claims, 13 Drawing Sheets

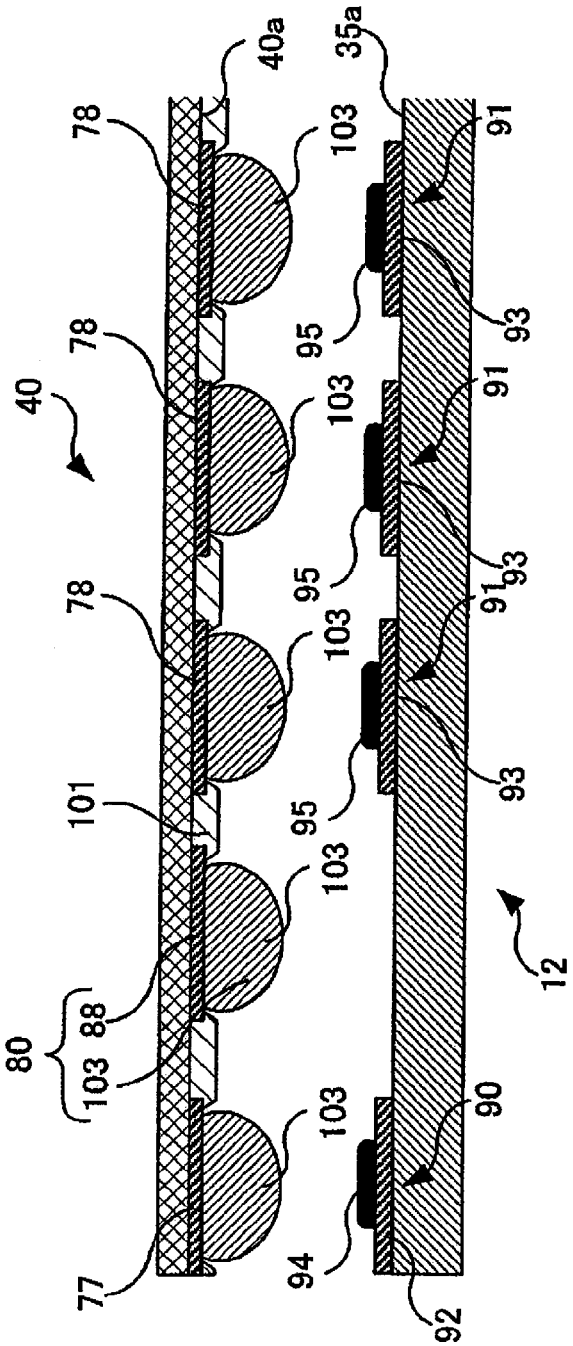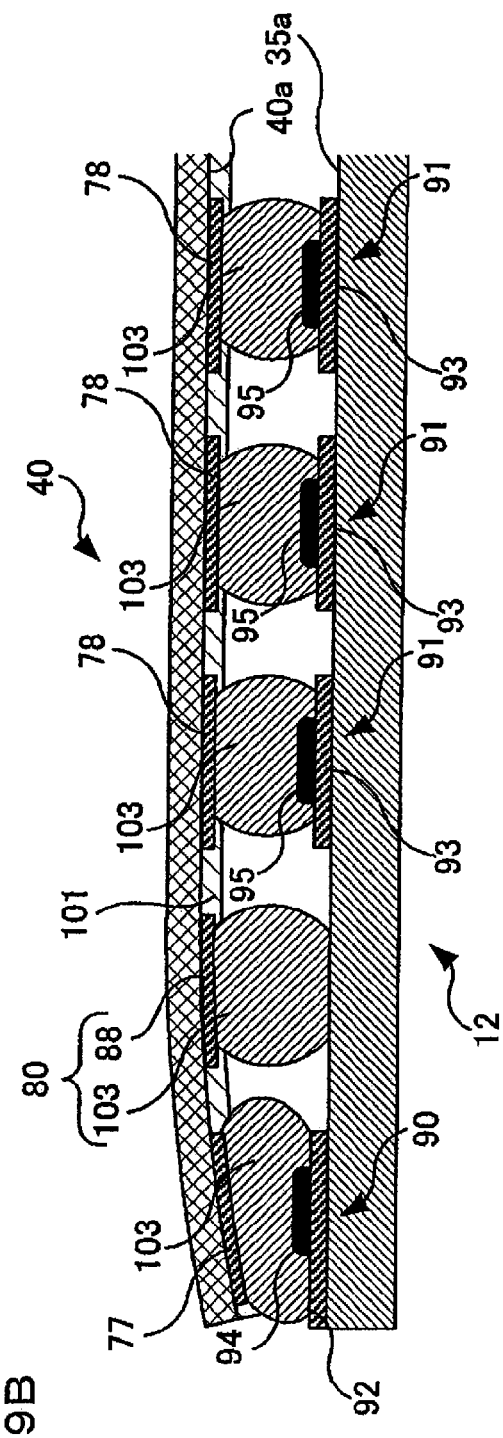
FIG. 9A
FIG. 9B

INK-JET HEAD AND CONNECTING STRUCTURE

BACKGROUND OF THE INVENTION

1. Field of the Invention

The present invention relates to an ink-jet head that ejects ink to a record medium, and also to a connecting structure between a flexible printed circuit and a terminal-formed member.

2. Description of Related Art

Some ink-jet heads include a passage unit, an energy applier, and a flexible printed circuit (FPC). Formed in the passage unit are nozzles that eject ink and pressure chambers that respectively communicate with the nozzles. The energy applier applies ejection energy to ink in the pressure chambers. The FPC supplies a drive signal to the energy applier. Known as the energy applier is, for example, a piezoelectric actuator unit that changes the volume of the pressure chambers and thereby applies pressure as the ejection energy to ink in the pressure chambers (see Japanese Patent Unexamined Publication No. 2002-36568).

The actuator unit disclosed in the aforementioned Publication includes individual electrodes respectively disposed at positions corresponding to the pressure chambers, a common electrode that extends over the pressure chambers, and a piezoelectric sheet sandwiched between the individual electrodes and the common electrode. On the actuator unit, drive-signal terminals electrically connected to the respective individual electrodes and constant-potential-signal terminals electrically connected to the common electrode are disposed. The constant-potential-signal terminals, each of which has a planar area larger than that of the drive-signal terminal, are located on both sides of a group of the drive-signal terminals. On the FPC, drive-signal electrodes and constant-potential-signal electrodes are disposed. Each of the drive-signal electrodes outputs a drive signal generated by a driver IC. The constant-potential-signal electrodes, each of which outputs a constant-potential signal used as a reference against the drive signal, are located on both sides of a group of the drive-signal electrodes. The drive-signal electrodes are respectively bonded to the drive-signal terminals with a solder which is a metal bond, and the constant-potential-signal electrodes are respectively bonded to the constant-potential-signal terminals with a solder. Thereby, the actuator unit and the FPC are connected to each other.

When a drive signal is applied from a drive-signal electrode through a drive-signal terminal to a corresponding individual electrode while the ground voltage as a constant-potential signal is applied from the constant-potential-signal electrode through the constant-potential-signal terminal to the common electrode, a portion of the piezoelectric layer sandwiched between this individual electrode and the common electrode incurs an electric field acting along a thickness direction of the piezoelectric layer, so that this portion of the piezoelectric layer expands. This changes the volume of a corresponding pressure chamber, and pressure as the ejection energy is applied to ink in the pressure chamber.

SUMMARY OF THE INVENTION

For connecting the FPC to the actuator unit, a solder is applied to each of the electrodes formed on the FPC, and then the FPC and the actuator unit in a layered state are heated. Here, since the constant-potential-signal terminal has a planar area larger than that of the drive-signal terminal as mentioned above, the solder applied to the constant-potential-signal electrode easily spreads along the plane of the constant-potential-signal terminal. In this case, a region of the FPC confronting the constant-potential-signal terminal is drawn toward the actuator unit due to surface tension of the solder.

When the FPC thus drawn gets too closer to the actuator unit, the solder connecting the constant-potential-signal terminal to the constant-potential-signal electrode and the solder connecting the drive-signal terminal to the drive-signal electrode spread over and along a space between the actuator unit and the FPC. These solders may disadvantageously come into contact and cause a short circuit.

An object of the present invention is to provide an ink-jet head and a connecting structure between a flexible printed circuit and a terminal-formed member, which are capable of suppressing a short circuit caused by contact between metal bonds that are used for connecting a flexible printed circuit to an energy applier, an actuator unit, or a terminal-formed member.

According to a first aspect of the present invention, there is provided an ink-jet head comprising a flexible printed circuit and a head main body. The flexible printed circuit has an electrode-formed face on which a constant-potential-signal electrode and a plurality of drive-signal electrodes are formed. The constant-potential-signal electrode is connected to a constant-potential-signal wiring, and each of the drive-signal electrodes is connected to a drive-signal wiring. The head main body has a plurality of nozzles that eject ink, a plurality of pressure chambers that respectively communicate with the nozzles and are arranged adjacent to one another, and an energy applier that applies ejection energy to ink in the pressure chambers on the basis of a drive signal. The energy applier has a terminal-formed face on which a plurality of drive-signal terminals and a constant-potential-signal terminal are formed. Each of the drive-signal terminals is supplied with a drive signal, and the constant-potential-signal terminal is supplied with a constant-potential signal. The constant-potential-signal terminal is bonded to the constant-potential signal electrode with a metal bond, and the drive-signal terminals are respectively bonded to the drive-signal electrodes with a metal bond. The ink-jet head further comprises a reinforcement that is located between the drive-signal terminals arranged adjacent to one another and the constant-potential-signal terminal. The reinforcement is in contact with and interposed between the terminal-formed face and the electrode formed face so that the terminal-formed face and the electrode formed face are spaced apart from each other.

According to a second aspect of the present invention, there is provided an ink-jet head comprising a flexible printed circuit, a passage unit, and an actuator unit. The flexible printed circuit has an electrode-formed face on which a constant-potential-signal electrode and a plurality of drive-signal electrodes are formed. The constant-potential-signal electrode is connected to a constant-potential-signal wiring, and each of the drive-signal electrodes is connected to each drive-signal wiring. The passage unit has a plurality of nozzles that eject ink, and a plurality of pressure chambers that respectively communicate with the nozzles and are arranged adjacent to one another. The actuator unit applies ejection energy to ink in the pressure chambers on the basis of a drive signal, and has a terminal-formed face on which a plurality of drive-signal terminals and a constant-potential-signal terminal are formed. Each of the drive-signal terminals is supplied with a drive signal, and the constant-potential-signal terminal is supplied with a constant-potential signal. The actuator unit includes a plurality of individual electrodes respectively connected to the drive-signal terminals, a common electrode connected to the constant-potential-signal terminal, and a piezoelectric layer sandwiched between the individual electrodes and the common electrode. The constant-potential-signal terminal is bonded to the constant-potential signal electrode with a metal bond, and the drive-signal terminals are bonded to the drive-signal electrodes with a metal bond. The ink-jet head further comprises a reinforcement that is located between the drive-signal terminals arranged adjacent to one another and the constant-potential-signal terminal. The reinforcement is in contact with and interposed between the terminal-formed face and the electrode formed face so that the terminal-formed face and the electrode formed face are spaced apart from each other.

In the aforesaid first and second aspects, even when a region of the flexible printed circuit confronting the constant-potential-signal terminal is being drawn toward the energy applier or the actuator unit due to surface tension of the metal bond, at the time the energy applier or the actuator unit is connected to the flexible printed circuit with the metal bond, the flexible printed circuit does not get excessively closer to the energy applier or the actuator unit because the reinforcement sustains the flexible printed circuit. This can relieve a problem that the metal bond spreads over and along a space between the flexible printed circuit and the energy applier or the actuator unit. Therefore, a short circuit caused by contact between metal bonds can be suppressed.

According to a third aspect of the present invention, there is provided an ink-jet head comprising a flexible printed circuit and a head main body. The flexible printed circuit has an electrode-formed face on which a plurality of electrodes are formed. The head main body has a plurality of nozzles that eject ink, a plurality of pressure chambers that respectively communicate with the nozzles and are arranged adjacent to one another, and an energy applier that applies ejection energy to ink in the pressure chambers on the basis of a drive signal. The energy applier has a terminal-formed face on which a plurality of terminals to be bonded to the respective electrodes of the flexible printed circuit are formed. The ink-jet head further comprises a reinforcement that is located between a terminal closest to an outer edge of the electrode-formed face of the flexible printed circuit and a terminal positioned more distant from the outer edge than the terminal closest to the outer edge. The reinforcement is in contact with and interposed between the terminal-formed face and the electrode-formed face so that the terminal-formed face and the electrode-formed face are spaced apart from each other.

According to a fourth aspect of the present invention, there is provided a connecting structure between a flexible printed circuit and a terminal-formed member. The flexible printed circuit has an electrode-formed face on which a plurality of electrodes are formed. The terminal-formed member has a terminal-formed face on which a plurality of terminals to be bonded to the respective electrodes of the flexible printed circuit are formed. The connecting structure further comprises a reinforcement that is located between a terminal closest to an outer edge of the electrode-formed face of the flexible printed circuit and a terminal positioned more distant from the outer edge than the terminal closest to the outer edge. The reinforcement is in contact with and interposed between the terminal-formed face and the electrode-formed face so that the terminal-formed face and the electrode-formed face are spaced apart from each other.

In the aforesaid third and fourth aspects, even when the outer edge of the flexible printed circuit is being drawn toward the energy applier or the terminal-formed member due to surface tension of the metal bond, at the time the energy applier or the terminal-formed member is connected to the flexible printed circuit with the metal bond, the flexible printed circuit does not get excessively closer to the energy applier or the terminal-formed member because the reinforcement sustains the flexible printed circuit. This can relieve a problem that the metal bond spreads over and along a space between the flexible printed circuit and the energy applier or the terminal-formed member. Therefore, a short circuit caused by contact between metal bonds can be suppressed.

BRIEF DESCRIPTION OF THE DRAWINGS

Other and further objects, features and advantages of the invention will appear more fully from the following description taken in connection with the accompanying drawings in which:

FIG. 9A is a partial sectional view showing the FPC and the piezoelectric actuator that are not connected yet;

FIG. 9B is a partial sectional view showing the FPC and the piezoelectric actuator that are connected;

DESCRIPTION OF THE PREFERRED EMBODIMENTS

In the following, a preferred embodiment of the present invention will be described with reference to the accompanying drawings.

Figure 1:
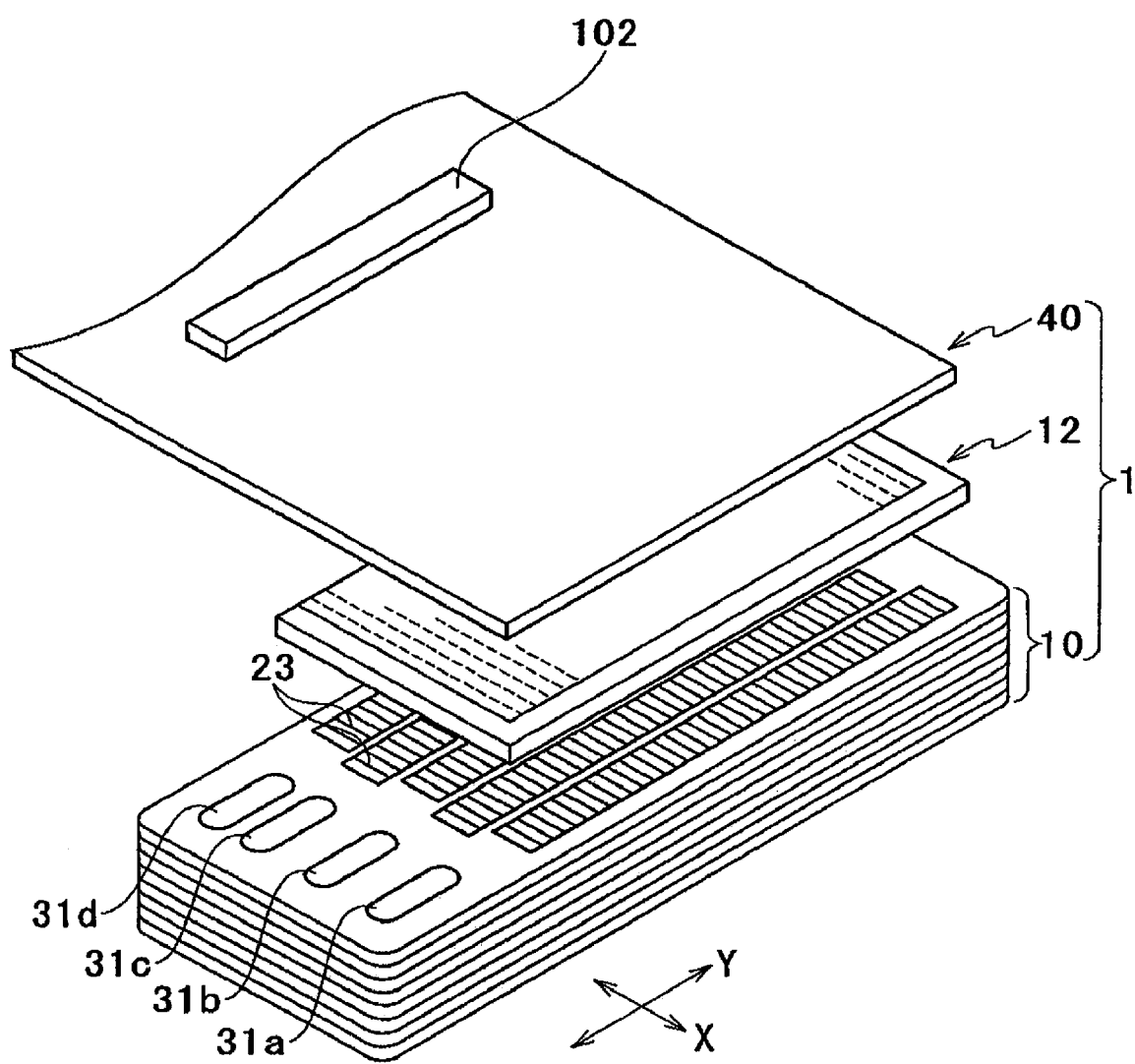
FIG. 1 is an exploded perspective view of an ink-jet head according to an embodiment of the present invention.

As shown in FIG. 1, an ink-jet head 1 of this embodiment includes a passage unit 10, a piezoelectric actuator 12, and an FPC 40. The head 1 is of so-called serial type, and mounted on a carriage (not illustrated) that reciprocates along a main scanning direction indicated by arrow X (hereinafter referred to as X direction) which is perpendicular to a paper conveyance direction or sub scanning direction indicated by arrow Y (hereinafter referred to as Y direction) The carriage accommodates removable ink cartridges containing cyan ink, magenta ink, yellow ink, and black ink, which are fed to the head 1.

Many nozzles 11*a* (see FIG. 2), which open in a lower face of the passage unit, respectively communicates with the pressure chambers 23 formed in an upper face of the passage unit 10. In order to eject ink from a nozzle 11*a*, the piezoelectric actuator 12 generates a pressure wave in a corresponding pressure chamber 23. The piezoelectric actuator 12 is of plate type, and bonded to the upper face of the passage unit 10 by means of an adhesive. The FPC 40 supplies to the piezoelectric actuator 12 a drive signal for driving the piezoelectric actuator 12 and a common signal which is a constant voltage signal. The FPC 40 is bonded to an upper face of the piezoelectric actuator 12.

Here, the passage unit 10 will be detailed with reference to FIGS. 2 and 3.

Figure 2:
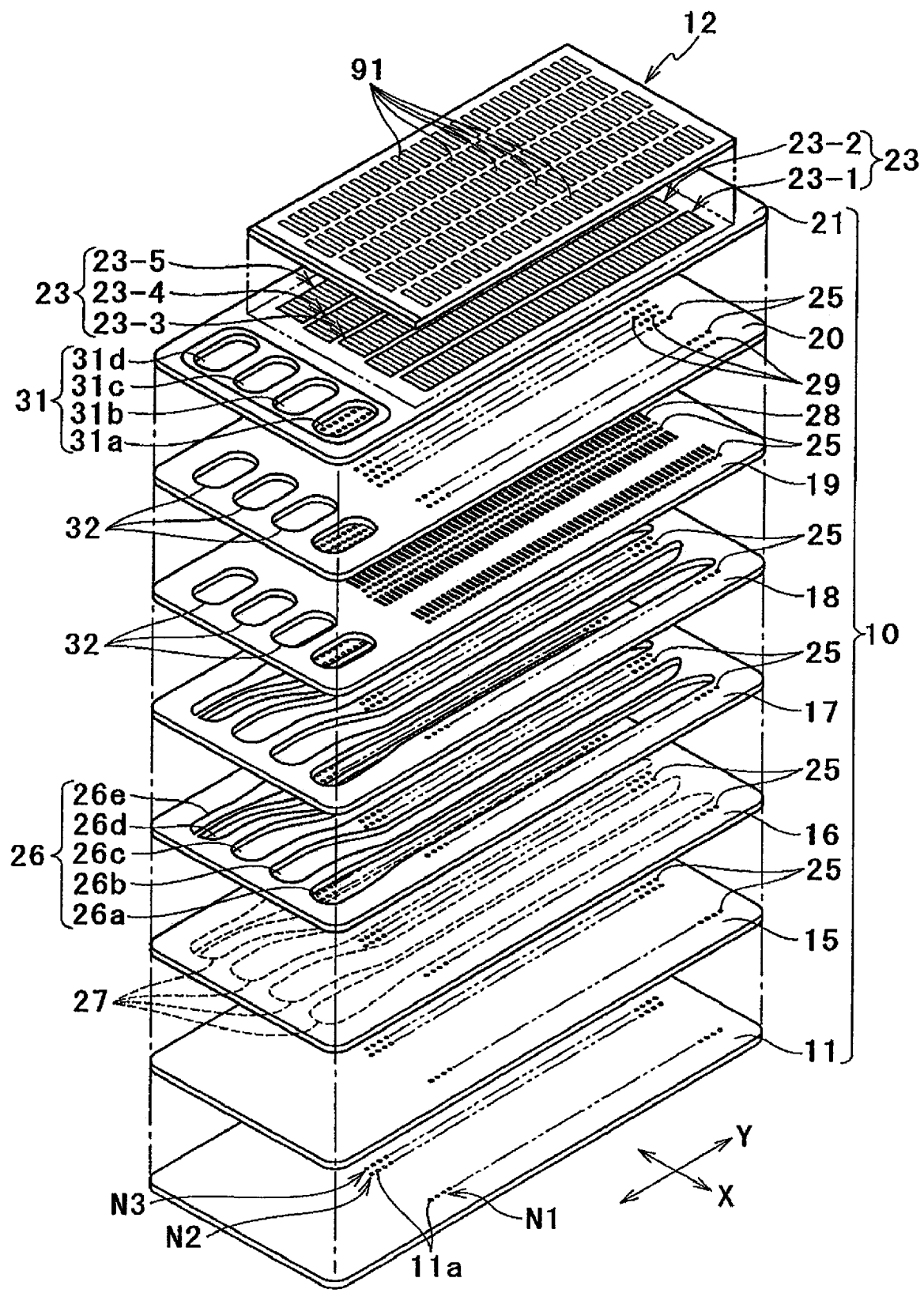
FIG. 2 is an exploded perspective view of a passage unit included in the ink-jet head shown in FIG. 1.

As shown in FIG. 2, the passage unit 10 has a total of eight flat plates, that is, from the lowermost one, a nozzle plate 11, a cover plate 15, a damper plate 16, two manifold plates 17, 18, two spacer plates 19, 20 and a base plate 21, which are put in layers and bonded with adhesive. The nozzle plate 11 is made of a synthetic resin, and the other plates 15 to 21 are made of 42% nickel alloy steel plate. Each of the plates 11, 15 to 21 has a thickness of approximately 50 to 150 µm.

Many nozzles 11*a* each having a small diameter of 25 µm are formed through the nozzle plate 11. The nozzles 11*a* are arranged in a zigzag pattern along the Y direction, and five nozzle rows are arranged at intervals with respect to the X direction. Among the five nozzle rows that extend along the Y direction, a first row N1, a second row N2, and a third row N3 are shown in FIG. 2, but fourth and fifth rows are not shown. Each of the first to fifth nozzle rows has a length of one inch and includes seventy-five nozzles 11*a*. Thus, the nozzles 11*a* are arranged at a density of 75 dpi (dot per inch). Nozzles 11*a* included in the first row N1 eject cyan ink, nozzles 11*a* included in the second row N2 eject yellow ink, nozzles 11*a* included in the third row N3 eject magenta ink, and nozzles 11*a* included in the fourth and fifth rows (not shown in FIG. 2) eject black ink.

Pressure chambers 23 that respectively correspond to the nozzles 11*a* are formed through the base plate 21. The pressure chambers 23, as well as the nozzles 11*a*, are arranged in a zigzag pattern along the Y direction, and five pressure chamber rows are arranged at intervals with respect to the X direction. In FIG. 2, the five pressure chamber rows extending along the Y direction are denoted by reference numerals 23-1, 23-2, 23-3, 23-4, and 23-5, respectively. As shown in FIG. 3, the pressure chambers 23 included in each row are disposed with partitions 24 interposed therebetween along the Y direction. The pressure chambers 23 are arranged in a so-called zigzag pattern so that the pressure chambers 23 included in one row are shifted from the pressure chambers 23 included in another neighboring row by a half pitch in the Y direction. Each pressure chamber 23 has a shape elongated along the X direction. One longitudinal end of each pressure chamber 23 communicates with a communication hole 29 formed through the upper spacer plate 20, and the other longitudinal end of each pressure chamber 23 communicates with a nozzle 11*a* via communication paths 25 formed through the cover plate 15, the damper plate 16, the manifold plates 17, 18, and the spacer plates 19, 20.

Four ink supply ports 31 are also formed through the base plate 21 to be located near one end of the base plate 21 in the Y direction. In FIG. 2, the four ink supply ports 31 formed at appropriate intervals in the X direction are denoted by reference numerals 31*a*, 31*b*, 31*c*, and 31*d*, respectively. Ink supply paths 32 respectively communicating with the ink supply ports 31 are formed through the spacer plates 19 and 20.

Ink passages, which respectively extend below the pressure chamber rows in the Y direction, are formed through the manifold plates 17 and 18 so that five common ink chambers 26 appear when the plates 17 and 18 are put in layers. One end of each common ink chamber 26 communicates with a corresponding ink supply path 32 and a corresponding ink supply port 31. In FIG. 2, the five common ink chambers are denoted by reference numerals 26*a*, 26*b*, 26*c*, 26*d*, and 26*e*, respectively. Via the ink supply paths 32 formed through the spacer plates 19 and 20, the common ink chamber 26*a*, 26*b*, and 26*c* communicate with the ink supply ports 31*a*, 31*b*, and 31*c*, respectively, and both of the common ink chambers 26*d* and 26*e* communicate with the ink supply port 31*d*.

A lower face of the damper plate 16 is recessed to form damper chambers 27 each having a shape to coincide with the common ink chamber 26 in a plan view, so that sealed-up damper chambers 27 appear when the damper plate 16 and the cover plate 15 are put in layers. Accordingly, when a pressure wave incurs in the pressure chamber 23, a retrograde component of the pressure wave which travels toward the common ink chamber 26 can be absorbed by vibration of a thin wall above the damper chamber 27, which thereby prevents so-called crosstalk.

Figure 3:
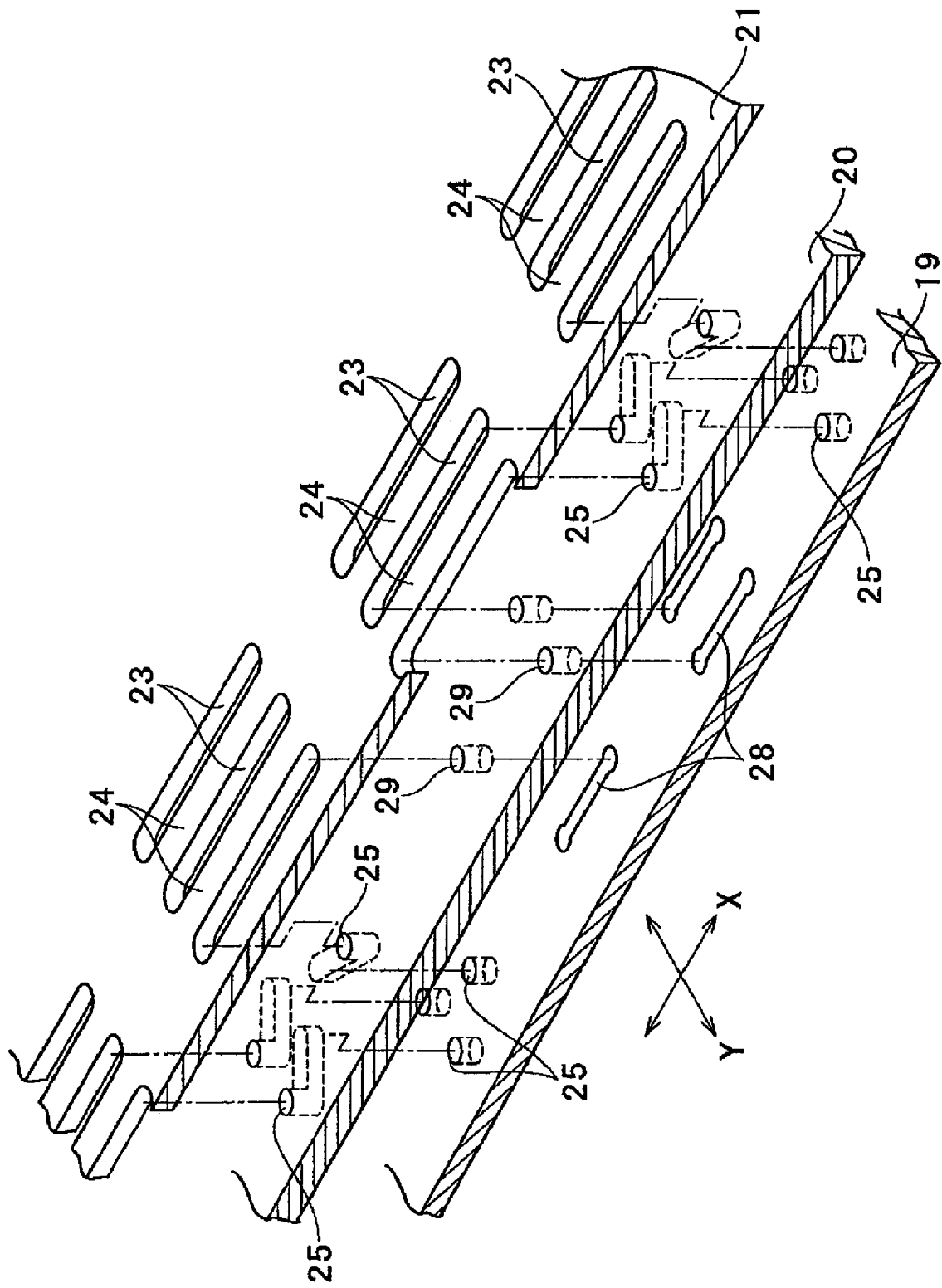
FIG. 3 is a partial enlarged view of FIG. 2.

As shown in FIG. 3, an upper face of the lower spacer plate 19 is recessed to form throttles 28 each having a shape elongated in the X direction. The throttles 28 correspond to the respective pressure chambers 23. Each throttle 28 has its one end communicating with a corresponding common ink chamber 26 and the other end communicating with a corresponding pressure chamber 23 via a communication hole 29 that is formed through the upper spacer plate 20.

Ink supplied to each ink supply port 31 flows into a corresponding common ink chamber 26, passes through throttles 28 and communication holes 29, and distributed to pressure chambers 23. Then, the ink goes from the pressure chambers 23 through communication paths 25 to nozzles 11*a* corresponding to these pressure chambers 23. Cyan ink, yellow ink, magenta ink, and black ink are respectively supplied to the ink supply ports 31*a*, 31*b*, 31*c*, and 31*d*.

Next, the piezoelectric actuator 12 will be detailed with reference to FIGS. 4, 5, 6, 7A, and 7B.

The piezoelectric actuator 12 has active portions which are portions of the piezoelectric sheets 33 and 34 sandwiched between the individual electrodes 36 and the common electrode 37. By applying a voltage to between a certain individual electrode 36 and the common electrode 37, an active portion of the piezoelectric sheet corresponding to this individual electrode 36 is distorted in the thickness direction due to the longitudinal piezoelectric effect. Via the FPC 40, a common signal is applied to the common electrode 37, and a drive signal is applied to the individual electrode 36. Change in voltage of the drive signal causes a voltage difference between the individual electrode 36 and the common electrode 37.

The active portions, the number of which is the same as that of the pressure chambers 23, are formed so as to coincide with the pressure chambers 23 in a plan view, respectively. That is, like the pressure chambers 23, the active portions each having a shape elongated along the X direction are arrayed in five rows along the direction of extension of the pressure chamber rows, i.e., along the Y direction. The active portions included in each row are shifted from the active portions included in another neighboring row by a half pitch in the Y direction, and are arranged in a so-called zigzag pattern.

Figure 4:
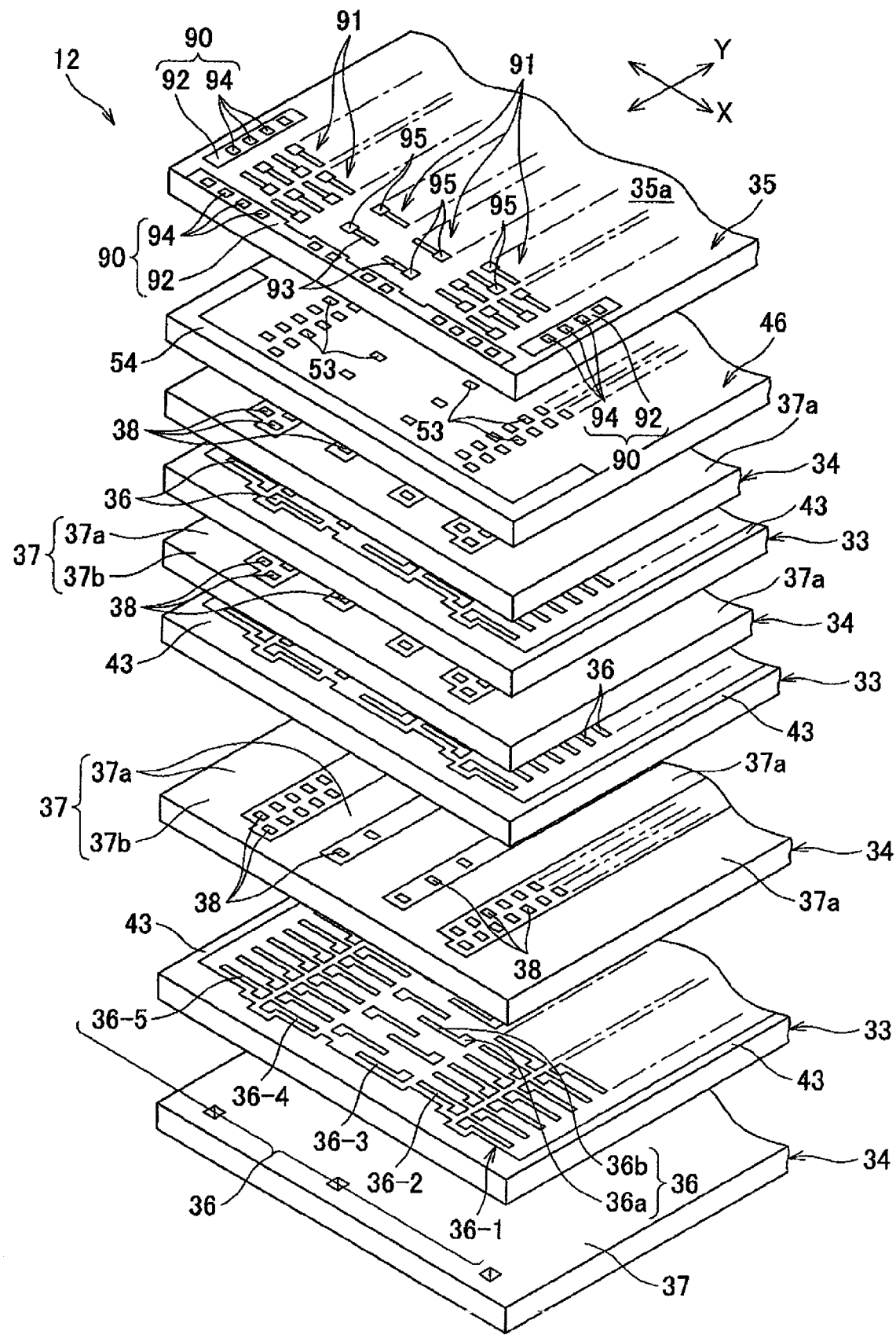
FIG. 4 is a partial exploded perspective view of a piezoelectric actuator included in the ink-jet head shown in FIG. 1.
Figure 5:
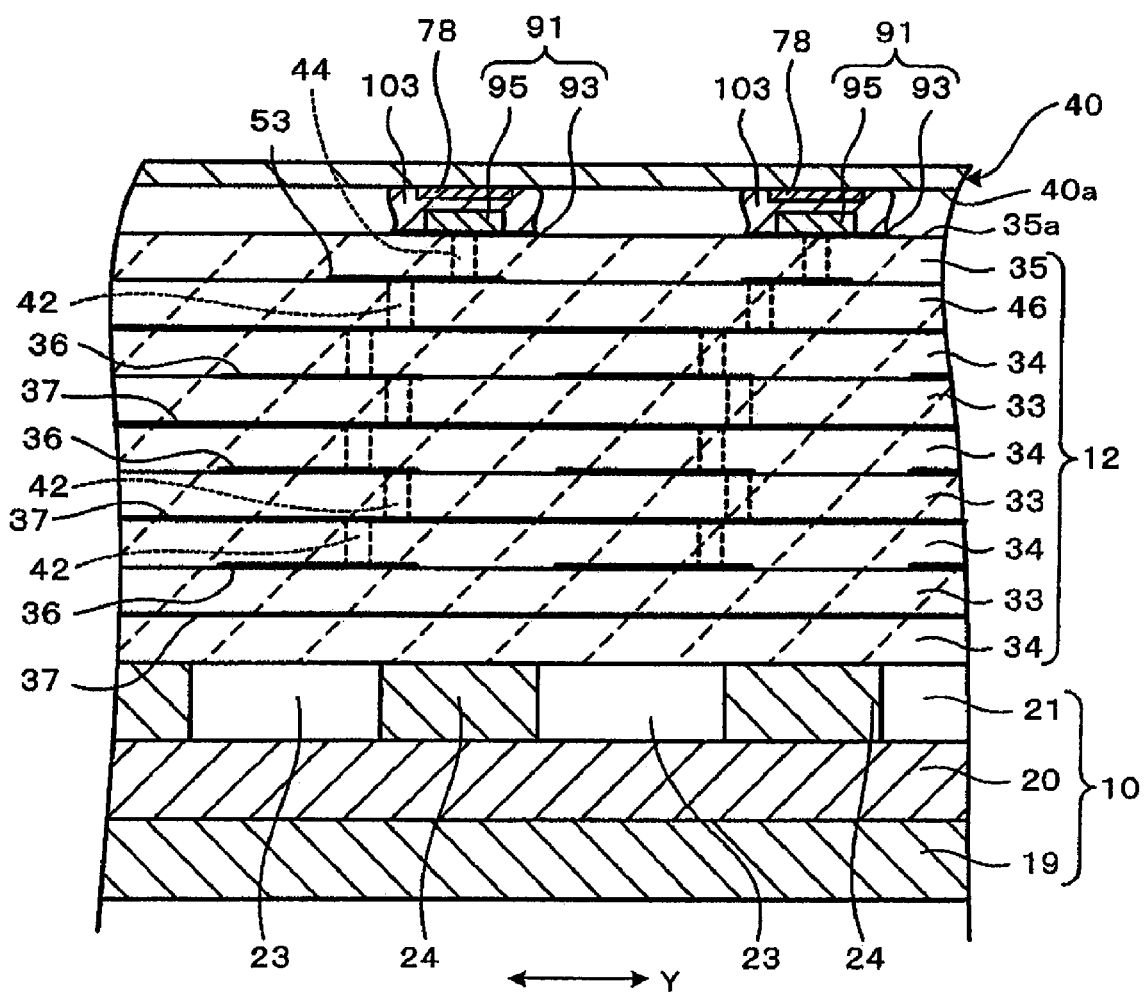
FIG. 5 is a partial enlarged sectional view of an FPC, the piezoelectric actuator, and the passage unit that are included in the ink-jet head shown in FIG. 1.

As shown in FIGS. 4 and 5, the piezoelectric actuator 12 includes a group of seven piezoelectric sheets 33 and 34, a restriction sheet 46 put on an upper face of the group, and a top sheet 35 put on an upper face of the restriction sheet 46. Each of the piezoelectric sheets 33 and 34 has a thickness of approximately 30 μm, and made of a piezoceramics plate. The restriction sheet 46 and the top sheet 35 may either be made of piezoceramics or other materials, as long as they are electrically insulative.

A pattern of the individual electrodes 36 respectively corresponding to the pressure chambers 23 is screen-printed on upper faces of the respective piezoelectric, sheets 33. Referring to FIG. 7B, as illustrated with alternate long and short dash lines, each of the individual electrodes 36 has a linear portion 36b of line shape and an end portion 36a which is an extension from the linear portion 36b toward an oblique direction. The linear portion 36b, which has a rectangular shape slightly smaller than a corresponding pressure chamber 23 (as illustrated with dotted lines in FIG. 7B), is positioned such that its outer edge is located within an outer edge of the corresponding pressure chamber 23. The end portion 36a is located outside the corresponding pressure chamber 23 and does not overlap the pressure chamber 23 in a plan view.

In FIG. 4, the individual electrodes 36 are arranged in rows 36-1, 36-2, 36-3, 36-4, and 36-5, which correspond to the pressure chamber rows 23-1, 23-2, 23-3, 23-4, 23-5, respectively. Only in the third row 36-3, the individual electrodes 36 are arranged in such a manner that the end portion 36a extends from a corresponding linear portion 36b in an alternate direction.

As shown in FIGS. 4 and 7B, in a plan view, each of the end portions 36a overlaps a connecting individual electrode 38 formed on an upper-layered piezoelectric sheet 34 and a connecting individual electrode 53 formed on the restriction sheet 46. Also as shown in FIG. 7B, each of the end portions 36a is positioned so as to be electrically connectable to an inner conductive electrode 42 that is formed in a through hole extending through an upper-layered piezoelectric sheet 34.

As shown in FIG. 4, a connecting common electrode 43 is also screen-printed on the upper faces of the respective piezoelectric sheets 33. The connecting common electrode 43 is formed along an edge of the piezoelectric sheet 33.

A common electrode 37 is screen-printed on upper faces of the respective piezoelectric sheets 34. The lowermost piezoelectric sheet 34 has the common electrode 37 formed throughout its entire upper face.

As shown in FIG. 4, each of the common electrodes 37 formed on the piezoelectric sheets 34 other than the lowermost one includes five first electrically-conductive portions 37a, and second electrically-conductive portions 37b. The five first electrically-conductive portions 37a extend along the longer side of the piezoelectric sheet 34, i.e., along the Y direction. The second electrically-conductive portions 37b extend along the shorter side of the piezoelectric sheet 34, i.e., along the X direction, and connect opposite ends of the first electrically-conductive portions 37a. In a plan view, the five first electrically-conductive portions 37a overlap the individual electrode rows 36-1 to 36-5, respectively.

Connecting individual electrodes 38 are also formed on the respective piezoelectric sheets 34 except the lowermost piezoelectric sheet 34. The connecting individual electrodes 38 form first island-like individual conductive portions. Each of the connecting individual electrodes 38 has a substantially rectangular shape and overlaps an end portion 36a of a corresponding individual electrode 36 in a plan view. Each row of the connecting individual electrode 38 is sandwiched between a neighboring pair of first electrically-conductive portions 37a.

Connecting individual electrodes 53, which respectively coincide with the connecting individual electrodes 38 in a plan view, and a connecting common electrode 54, which acts as a common conductive portion, are formed on the upper face of the restriction sheet 46. The connecting common electrode 54 is formed along the shorter side of the restriction sheet 46. In a plan view, the connecting common electrode 54 overlaps the second electrically-conductive portion 37b of the common electrode 37 and also overlaps a part of the connecting common electrode 43.

Through holes are formed in regions of the piezoelectric sheets 33 formed with the connecting common electrodes 43, in regions of the piezoelectric sheets 34, except the lowermost one, formed with the common electrodes 37, and in a region of the restriction sheet 46 formed with the connecting common electrode 54. Each of the through holes is filled with a conductive paste to form an inner conductive electrode (not shown), so that the common electrodes 37, the connecting common electrodes 43 and 54 which are aligned in the vertical direction are electrically connected.

In the same manner, through holes are formed in regions of the piezoelectric sheets 33 formed with the end portions 36a of the individual electrodes 36, in regions of the piezoelectric sheet 34 formed with the connecting individual electrodes 38, and in regions of the restriction sheet 46 formed with the connecting individual electrodes 53. Each of the through holes is filled with a conductive paste to form an inner conductive electrode 42 (see FIG. 5), so that the individual electrodes 36, the connecting individual electrodes 38 and 53 which are aligned in the vertical direction are electrically connected with one another. The inner conductive electrodes 42 formed in the respective sheets 33, 34, and 46 are arranged at appropriate intervals so as not to overlap in a plan view (see FIG. 5 and FIG. 7B).

As shown in FIG. 4, on a terminal-formed face 35a, i.e., an upper face, of the top sheet 35, external terminals 90 associated with the common electrodes and external terminals 91 associated with the individual electrodes are formed. The external terminals 90 are bonded to bond electrodes 77 of the FPC 40, and the external terminals 91 are bonded to bond electrodes 78 of the FPC 40. An external terminal 90 includes a thin surface electrode 92, and a thick bond terminal 94 that is formed on the surface electrode 92. An external terminal 91 includes a thin surface electrode 93, and a thick bond terminal 95 that is formed on the surface electrode 92 (see FIGS. 4, 5, and 6). The external terminals 90 extend like a belt along an outer edge of the terminal-formed face 35a, while the external terminals 91 are arranged at regular intervals and form groups. To be more specific, the external terminals 91 are arranged in a zigzag pattern while forming rows which extend along the Y direction and correspond to the pressure chamber rows 23-1 to 23-5, as shown in FIGS. 2 and 4.

As shown in FIG. 4, the surface electrode 92 of the external terminal 90 has a belt-like shape which overlaps the connecting common electrode 54 of the restriction sheet 46 in a plan view. The bond terminals 94 each having an appropriate shape are attached onto the surface electrode 92. The external terminal 90 has a planar area larger than that of the external terminal 91.

Figure 6:
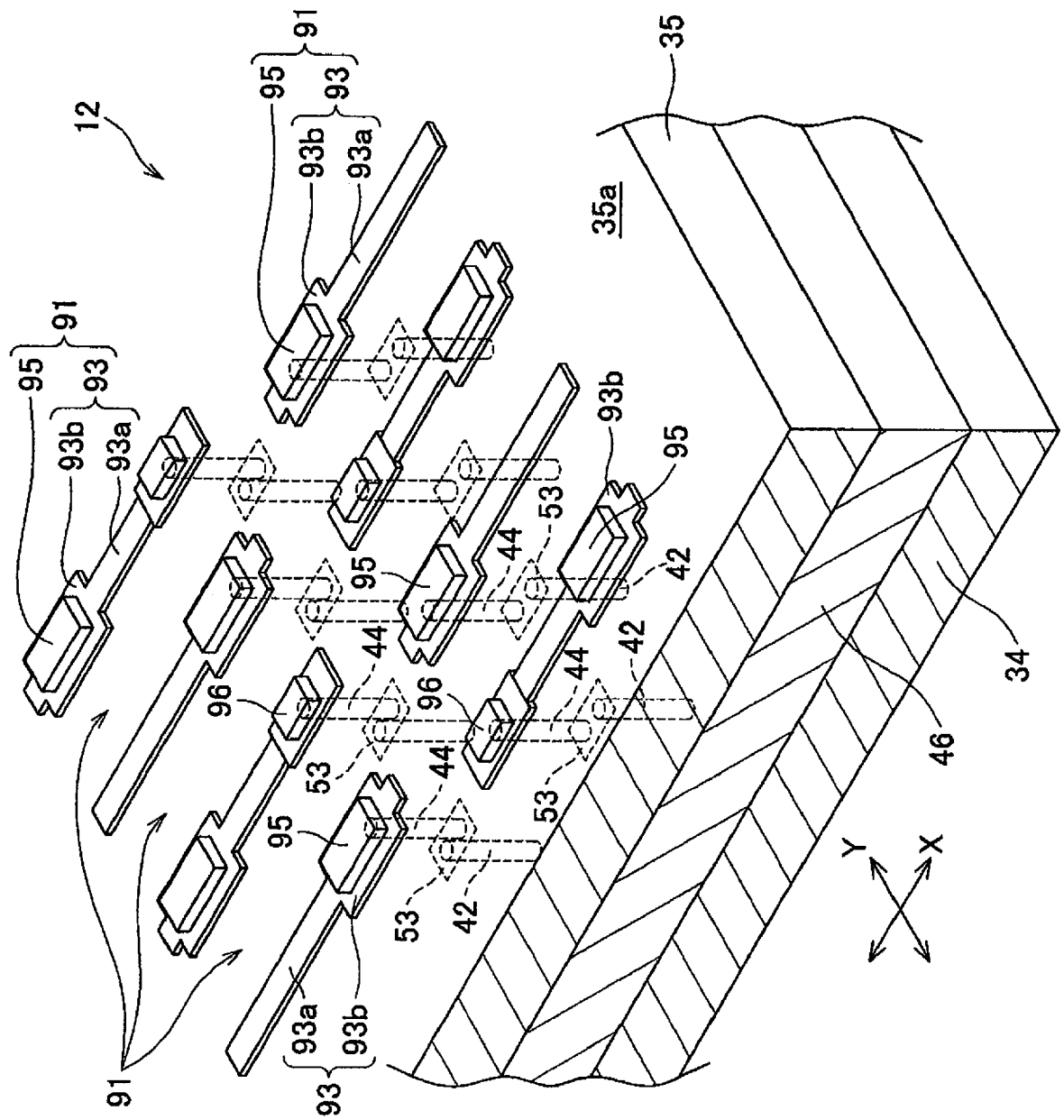
FIG. 6 is a partial perspective view showing external terminals formed on an upper face of the piezoelectric actuator.

As shown in FIG. 6, the surface electrode 93 of the external terminal 91 includes a narrow portion 93a and a wide portion 93b. The narrow portion 93a extends in the X direction, and the wide portion 93b is connected to the narrow portion 93a. The external terminals 91 are arranged in such a manner that, with respect to the Y direction, the wide portion 93b extends from a corresponding narrow portion 93a in an alternate direction. Therefore, even though the external terminals 91 include the wide portions 93b, they can be spaced apart enough from neighboring external terminals 91 with respect to the Y direction, thus suppressing an electrical short circuit caused by contact between the external terminals 91.

As shown in FIG. 7B, a width W2 of the narrow portion 93a is smaller than a width W1 of the partition 24 that defines the pressure chambers 23 (W2<W1). A width W3 of the wide portion 93b is slightly larger than the width W1 of the partition 24. In a plan view, each of the surface electrodes 93 partly overlaps a connecting individual electrode 53 of the restriction sheet 46.

As shown in FIGS. 5 and 7B, the surface electrodes 93 are respectively located above the partitions 24. That is, an arrangement of the surface electrodes 93 is shifted from the arrangement of the pressure chambers 23 by a half pitch, and an interval between the surface electrodes 93 is the same as the interval P0 between the pressure chambers 23 with respect to the Y direction. In this embodiment, the arrangement interval P0 is approximately 0.339 μm, the width W1 is approximately 120 to 150 μm, the width W2 is approximately 100 μm, the width W3 is approximately 150 to 300 μm and more preferably 200 to 220 μm, and a length L3 of the wide portion 93b is approximately 360 μm (see FIGS. 7A and 7B). A thickness of the surface electrode 93 is approximately 1 to 2 μm.

The bond terminal 95 attached to a surface of the wide portion 93b has an area smaller than that of the wide portion 93b, and is arranged so that an outer edge of the bond terminal 95 is located inside an outer edge of the wide portion 93b. In this embodiment, a width W4 of the bond terminal 95 is approximately 150 to 200 μm, and a distance W5 between the outer edge of the bond terminal 95 and the outer edge of the wide portion 93b is approximately 25 μm. A thickness of the bond terminal 95 is approximately 20 μm.

Through holes are formed in regions of the top sheet 35 formed with the external terminals 90 and 91. Each of the through holes is filled with a conductive paste to form an inner conductive electrode 44 (see FIGS. 5 and 6), so that the bond terminal 90 is electrically connected to the connecting common electrode 54 and that the respective bond terminals 91 are electrically connected to the connecting individual electrodes 53.

In order that upper portions of the inner conductive electrodes 44 which are in contact with the surface electrodes 92 and 93 do not be exposed on the terminal-formed face 35a, i.e., on the piezoelectric actuator 12, filling electrodes 96 made of the same material as of the bond terminals 94 and 95 are provided on the upper portions of the inner conductive electrodes 44. Thereby, portions where the inner conductive electrodes 44 are connected to the surface electrodes 92 and 93 are protected.

Figure 7A:
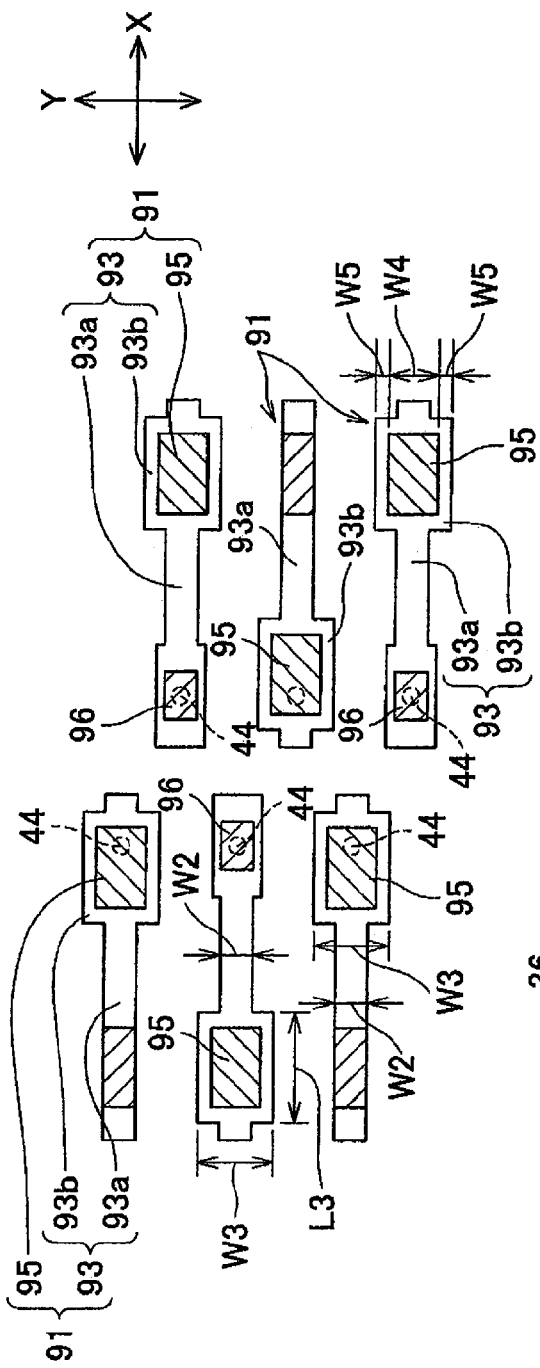
FIG. 7A is a plan view showing a positional relationship of the external terminals.
Figure 7B:
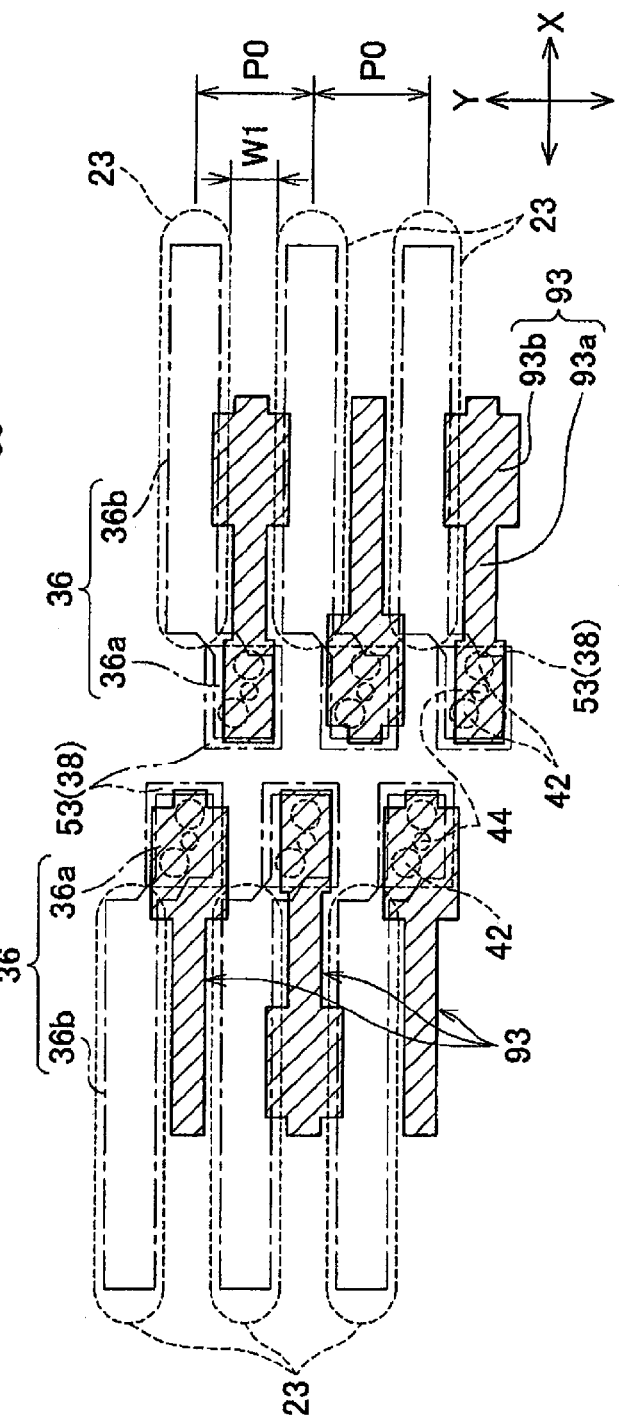
FIG. 7B is a plan view showing a positional relationship between the external terminals and pressure chambers, etc.

As shown in FIGS. 6 and 7A, the inner conductive electrodes 44 corresponding to the respective surface electrodes 93 are arranged along the Y direction, and protected alternatingly by the bond terminal 95 and by the filling electrode 96 with respect to the Y direction. That is, the bond terminals 95, which are included in the respective external terminals 91 arranged in the Y direction, alternately serve as the filling electrode 96, too.

Shapes of the filling terminals 96 and the bond terminals 94, 95 may be not only rectangle but also other appropriate shapes such as an oval, an ellipse, and the like.

To make the piezoelectric actuator 12, the laminated piezoelectric sheets 33 and 34, each of which has the surface electrodes 92, 93, electrodes 36, 37, or the like formed thereon, are sintered to be integrated with each other. Then, the bond terminals 94 and 95 are respectively attached onto the surface electrodes 92 and 93 by means of a printing or plating. The surface electrodes 92 and 93, which change in their properties in the sintering step, cannot be properly bonded to later-described solders 103. However, in this embodiment, the bond terminals 94 and 95 formed after the sintering step are bonded to the solders 103, thereby resolving the above bonding problem.

Next, a construction of the FPC 40 will be described with reference to FIGS. 8A and 8B. As shown in FIG. 1, the FPC 40 has its one end put on the piezoelectric actuator 12 and extends outward in the X direction.

Figures 8A, 8B:
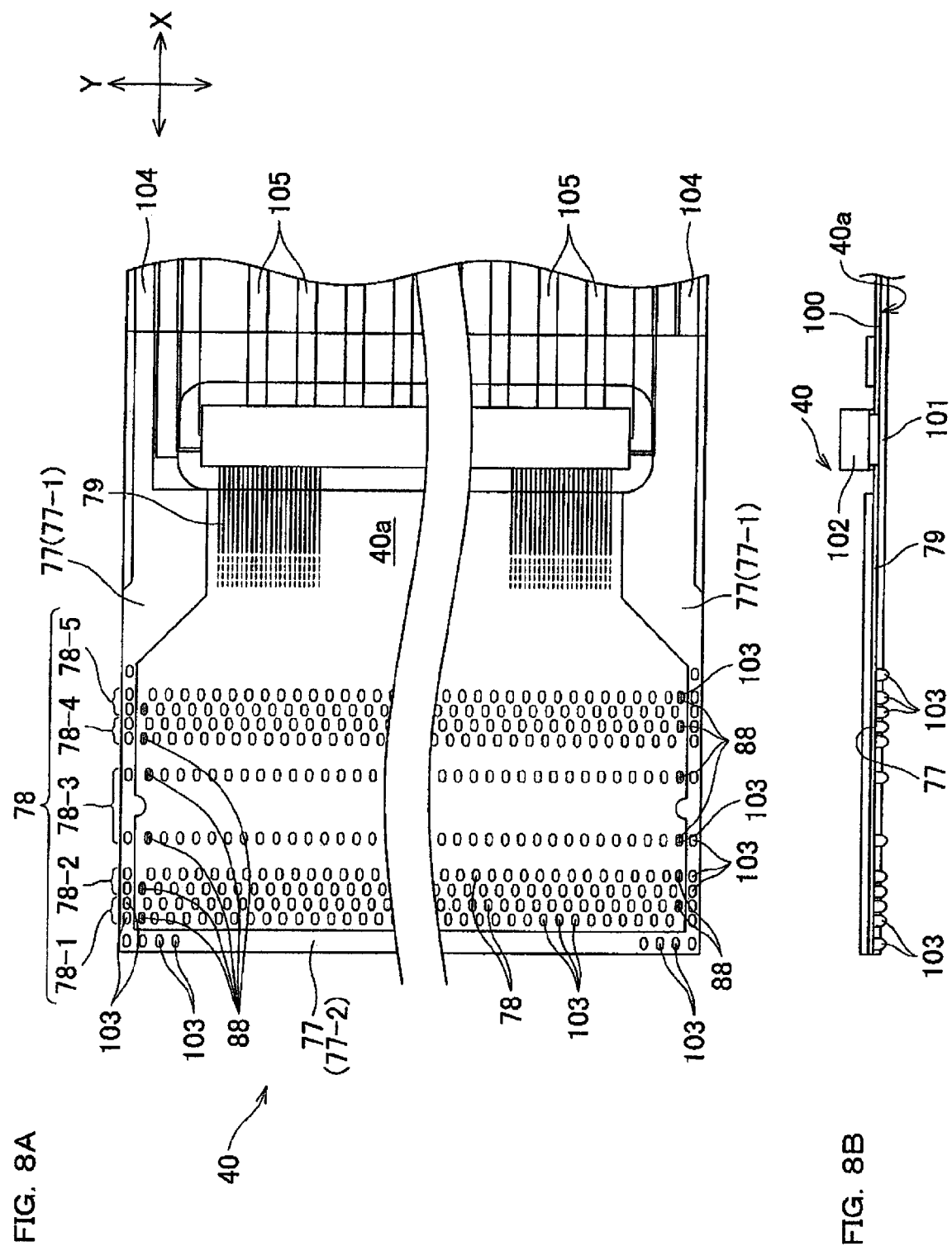
FIG. 8A is a plan view showing bond terminals, wirings, an integrated circuit, etc., that are provided on an electrode-formed face of the FPC.
FIG. 8B is a side-view of FIG. 8A.

As shown in FIGS. 8A and 8B, the FPC 40 has a band-like base 100 that are elongated in the X-direction and made of an electrically-insulative, flexible synthetic resin material, e.g., a polyimide resin, a polyester resin, and a polyamide resin. A lower face of the base 100 is an electrode-formed face 40a on which the bond electrodes 77 associated with the common electrodes, the bond electrodes 78 associated with the individual electrodes, dummy electrodes 88, micro wirings 79, and terminals 104 and 105 are formed by a process using photoresist or the like. The electrodes 77, 78 and 88, the wirings 79, and terminals 104 and 105 are made of copper. The electrode-formed face 40a is covered by a cover lay 101 with portions where the solders 103 are applied uncovered. The cover lay 101 is made of an electrically-insulative, flexible synthetic resin material, e.g., a polyimide resin, a polyester resin, and a polyamide resin.

The bond electrodes 77 are formed along an outer edge of the FPC 40, and include first common bond electrodes 77-1 in a pair that extend in the X direction and a second common bond electrode 77-2 that extends in the Y direction. Opposite ends of the second common bond electrode 77-2 are connected to one ends of the respective first common bond electrodes 77-1. The other ends of the respective first common bond electrodes 77-1 are connected to the connection terminals 104. Many solders 103 are applied onto the bond electrode 77 so as to confront the respective bond terminals 94 of the external terminals 90 formed on the upper face of the piezoelectric actuator 12. The bond electrode 77 is bonded to the external terminal 90 of the piezoelectric actuator 12 with the solder 103.

The bond electrodes 78 respectively confront the bond terminals 95 of the external terminals 91 shown in FIGS. 2 and 4, and are arranged in a zigzag pattern while forming row-groups (denoted by 78-1, 78-2, 78-3, 78-4, and 78-5 in FIG. 8A) which extend along the Y direction and correspond to the pressure chamber rows 23-1 to 23-5, respectively. Each of the row-groups 78-1, 78-2, 78-3, 78-4, and 78-5 includes two rows of bond electrodes 78. The bond electrodes 78 are respectively bonded to the external terminal 91 of the piezoelectric actuator 12 with a solder 103 applied thereon, a shape and a size of which are the same as those of the solder applied onto the bond electrode 77.

A shape and a size of the dummy electrode 88 are the same as those of the bond electrode 78. The dummy electrodes 88 are arranged so as to extend between the first common bond electrodes 77-1 and a group of the bond electrodes 78 along the X direction or an extending direction of the first common bond electrodes 77-1 and so as to confront regions of the upper face of the piezoelectric actuator between the external terminals 90 and the external terminals 91. A solder 103 is applied onto each of the dummy electrodes 88. The dummy electrodes 88, together with the solders 103, form reinforcements 80 (see FIG. 9A).

The above-described solders 103 that are applied onto the respective electrodes are altogether formed by a screen-printing, and thus substantially the same quantity of solder 103 is applied to the respective electrodes.

A driver IC 102 is mounted on the FPC 40. The number of wirings 79 that extend in the X direction is the same as that of the nozzles 11a or pressure chambers 23. Each of the wirings 79 has its one end connected to a corresponding bond electrode 78 and the other end connected to the diver IC 102. Thus, the bond electrodes 78 are electrically connected to respective terminals of the driver IC 102 via the wirings 79. The driver IC 102 converts recording data that are serial-transferred from an external equipment, e.g., a control board of a main body of a recording apparatus including a head 1, into parallel data that correspond to the respective nozzles 11a. Then, the driver IC 102 generates waveform signals of predetermined voltage corresponding to the recording data, and outputs the waveform signals to the respective wirings 79. The wirings 79 transmit the waveform signals to the bond electrodes 78, respectively.

In a region of the base 100 that is closer to the external equipment than the driver IC, many terminals 105 are arranged along the X direction, and also terminals 104 are provided on both sides of a group of the many terminals 105. The terminals 104 are electrically connected to the bond electrode 77, and the terminals 105 are electrically connected to the driver IC 102. In order to connect the piezoelectric actuator 12 to the driver IC 102, the wirings 79 must be formed at a high density such that the number of the wirings 79 is the same as the number of nozzles as shown in FIG. 8A. Meanwhile, in the region closer to the external equipment than the driver IC, since serial data are transferred from the external equipment to the driver IC 102, the terminals 105 are formed at a low density.

Next, connection of the FPC 40 to the piezoelectric actuator 12 will be described with reference to FIGS. 9A and 9B.

As shown in FIG. 9A, in order to connect the FPC 40 to the piezoelectric actuator 12, the solders 103 are applied to the respective electrodes 77, 78, 88 and then the FPC 40 and the piezoelectric actuator 12 are positioned in such a manner that the bond electrodes 77 confront the bond terminals 94 of the external terminals 90 and the bond electrodes 78 confront the bond terminals 95 of the external terminals 91. Then, the FPC. 40 and the piezoelectric actuator 12 in a layered state are heated while being pressed, to melt the solders 103. Thereby, the bond electrodes 77 are electrically and mechanically connected to the external terminals 90 with the solders 103, and the bond electrodes 78 are electrically and mechanically connected to the external terminals 91 with the solders 103 (see FIG. 9B).

The reinforcements 80, located between a group of the external terminal 91 and the external terminals 90, are in contact with and interposed between the terminal-formed face 35a of the piezoelectric actuator 12 and the electrode-formed face 40a of the FPC 40 so that the terminal-formed face 35a and the electrode-formed face 40a are spaced apart from each other. A height of the reinforcement 80 is substantially the same as a distance between the electrode-formed face 40a and the terminal-formed face 35a in a portion where the external terminals 91 and the bond electrodes 78 are bonded with the solder 103.

The heating for connecting the FPC 40 to the piezoelectric actuator 12 causes the solders 103 applied to the respective electrodes 77, 78, and 88 to melt and wetly spread along the bond terminals 94 and 95 of the external terminals 90 and 91. Here, since the external terminal 90 has a planar area larger than that of the external terminal 91, the solder 103 at the external terminal 90 can spread more easily. Therefore, regions of the FPC 40 confronting the external terminals 90 are drawn toward the piezoelectric actuator 12 due to surface tension of the solders 103. However, the FPC 40 does not get excessively closer to the piezoelectric actuator 12, because the reinforcements 80 disposed near the external terminals 90 sustain the FPC 40. This can relieve the problem that the solders 103 spread over and along the space between the piezoelectric actuator 12 and the FPC 40. Therefore, a short circuit between caused by contact between the solders 103 can be suppressed.

A short circuit can be suppressed more effectively in this embodiment than a case where a distance between the bond electrodes 78 and the bond electrodes 77 is simply made larger in order to suppress a short circuit.

As shown in FIG. 4, the external terminals 91 are arranged at predetermined intervals and form groups. The external terminals 90 are disposed closer to the outer edge of the terminal-formed face 35a of the top sheet 35 than the groups of the external terminals 91 are. This means that the bond terminals 94 of the external terminals 90 are not disposed between the bond terminals 95 of the external terminals 91. Therefore, the bond terminals 95 can be arranged in an efficient manner, so that the ink-jet head 1 can be downsized.

As described above, the height of the reinforcement 80 is substantially the same as the distance between the electrode-formed face 40a of the FPC 40 and the terminal-formed face 35a of the piezoelectric actuator 12 in a portion where the external terminal 91 and the bond electrode 78 are bonded with the solder 103. Therefore, the FPC 40 can effectively be restrained from being drawn toward the piezoelectric actuator 12. Moreover, the piezoelectric actuator 12 and the FPC 40 can be spaced at a uniform distance. Accordingly, the FPC 40 cannot easily be distorted, so that accurate connection between the bond terminals and the bond electrodes are realized.

Since the reinforcement 80 includes the dummy electrode 88 and the solder 103 applied to the dummy electrode 88, the solder 103 of the reinforcement 80 and the solders 103 respectively connecting the external terminals 90 and 91 to the bond electrodes 77 and 78 are melted substantially under the same condition, to connect the FPC 40 to the piezoelectric actuator 12. This also provides the aforementioned effect, that is, the effect that the piezoelectric actuator 12 and the FPC 40 can be spaced at a uniform distance, and that the FPC 40 cannot easily be distorted so that accurate connection between the bond terminals and the bond electrodes are realized. In addition, application of the solders 103 onto the dummy electrodes 88 to form the reinforcements 80 can be performed simultaneously with application of the solders 103 to the bond electrodes 77 and 78. This can reduce a cost of manufacturing the ink-jet head 1.

Since the dummy electrodes 88 and the bond electrodes 78 have the same shape and the same size, the solders 103 applied to the respective electrodes 78 and 88 are melted surely under the same condition, to connect the FPC 40 to the piezoelectric actuator 12. Therefore, the piezoelectric actuator 12 and the FPC 40 can more efficiently be spaced at a uniform distance.

As shown in FIG. 4, the external terminals 90 associated with the common electrodes are formed along a part of the outer edge of the terminal-formed face 35a of the piezoelectric actuator 12. Therefore, the external terminals 91 and the bond electrodes 78 can be arranged at a high density.

Since the external terminal 90 has a planar area larger than that of the external terminal 91, the external terminal 90 can transmit the common signal efficiently.

Next, modifications of the above-described embodiment will be described.

Figure 10:
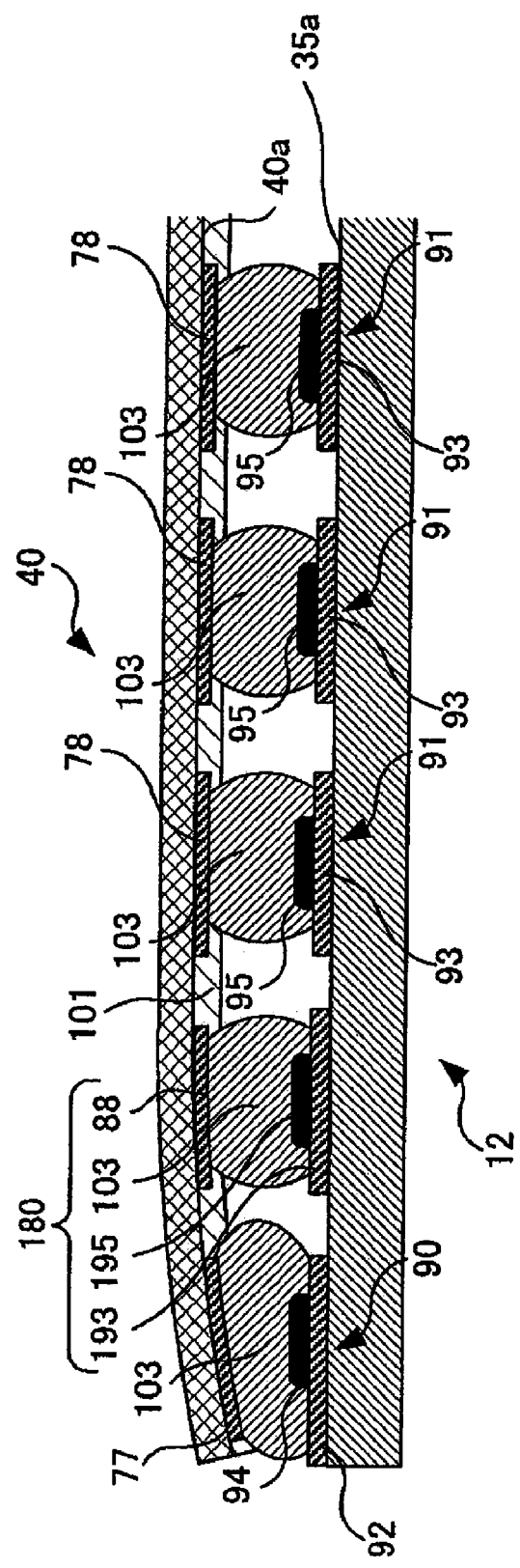
FIG. 10 is a partial sectional view showing a state of connection between an FPC and a piezoelectric actuator that are included in an ink-jet head according to a first modification.

FIG. 10 shows a first modification. In this modification, on the upper face of the top sheet 35 of the piezoelectric actuator 12, i.e., on the terminal-formed face 35*a*, surface electrodes 193 and bond terminals 195, which do not contribute to signal transfer, are further provided at positions confronting the dummy electrodes 88. A material, a shape, and a size of the surface electrode 193 are the same as those of the surface electrode 93, and a material, a shape, and a size of the bond terminal 195 are the same as those of the bond terminal 95. When the FPC 40 is connected to the piezoelectric actuator 12, the solders 103 applied onto the dummy electrodes 88 bond the dummy electrodes 88 to the surface electrodes 193 and the bond terminals 195. A reinforcement 180 of this modification is made up of a dummy electrode 88, a solder 103, a surface electrode 193, and a bond terminal 195. In this case, the solder 103 that bonds the dummy electrode 88 to the surface electrode 193 and the bond terminal 195, and the solders 103 respectively connecting the external terminals 90 and 91 to the bond electrodes 77 and 78 are melted under the same condition. Accordingly, the piezoelectric actuator 12 and the FPC 40 can be spaced at a more uniform distance.

Furthermore, the solder 103 applied onto the dummy electrode 88 is bonded to the bond terminal 195 formed on the piezoelectric actuator 12, so that the reinforcement 180 fixes the terminal-formed face 35*a* to the electrode-formed face 40*a* so as to resist a force in a direction where the terminal-formed face 35*a* and the electrode-formed face 40*a* are made distant from each other. This provides an improved bonding strength compared with a case where the solder 103 applied onto the dummy electrode 88 directly contacts with the upper face of the piezoelectric actuator 12 like the above-described embodiment. That is, a bond strength between the FPC 40 and the piezoelectric actuator 12 is improved on their outer edge where the reinforcements 180 are arranged. Thus, even when an external force to peel off the FPC 40 from the piezoelectric actuator 12 is applied, the reinforcement 180 resists the force to suppress an open circuit caused by the terminals 90 and 91 and the electrodes 77 and 78 disconnected.

Figure 11A:
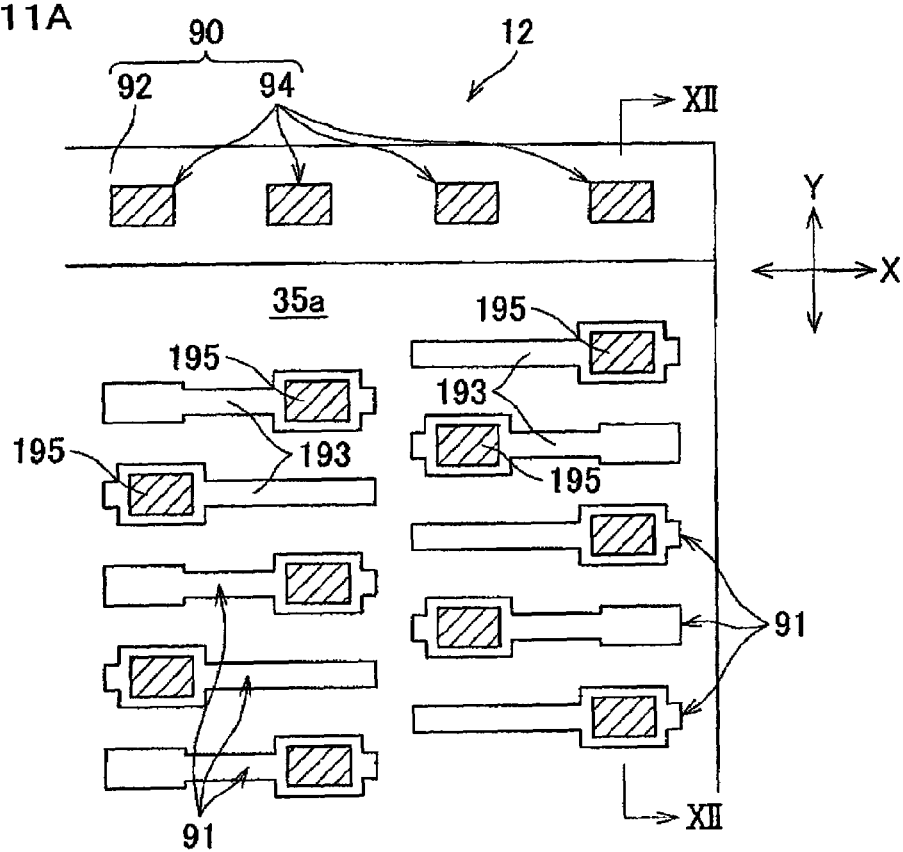
FIG. 11A is a plan view showing a terminal-formed face of an piezoelectric actuator included in an ink-jet head according to a second modification.
Figure 11B:
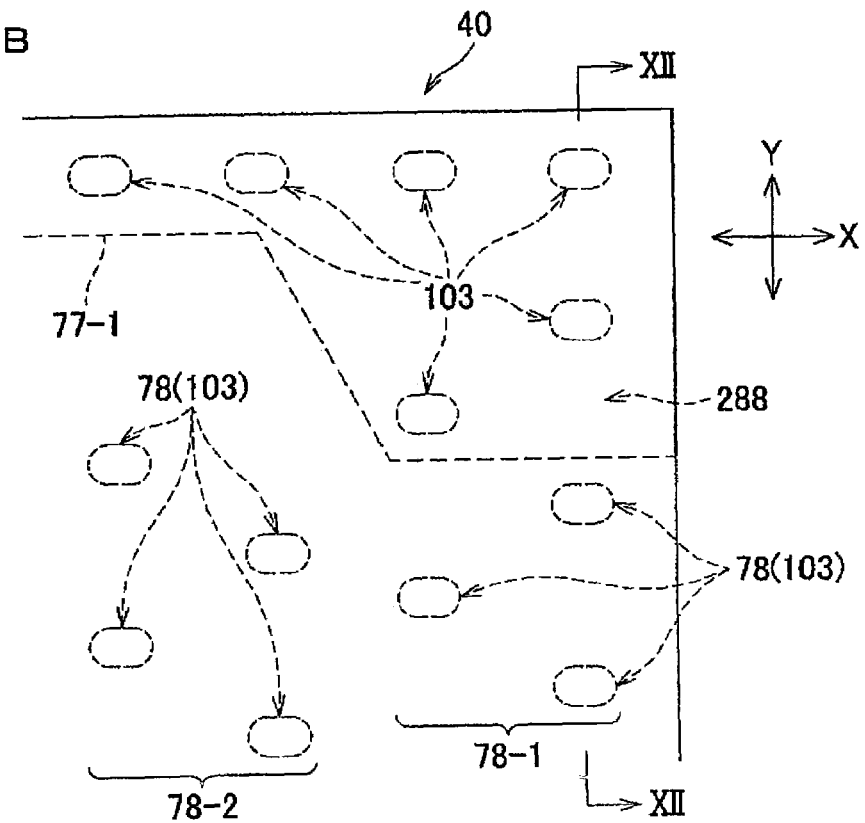
FIG. 11B is a plan view showing a face opposite to an electrode-formed face of an FPC included in the ink-jet head according to the second modification.
Figure 12:
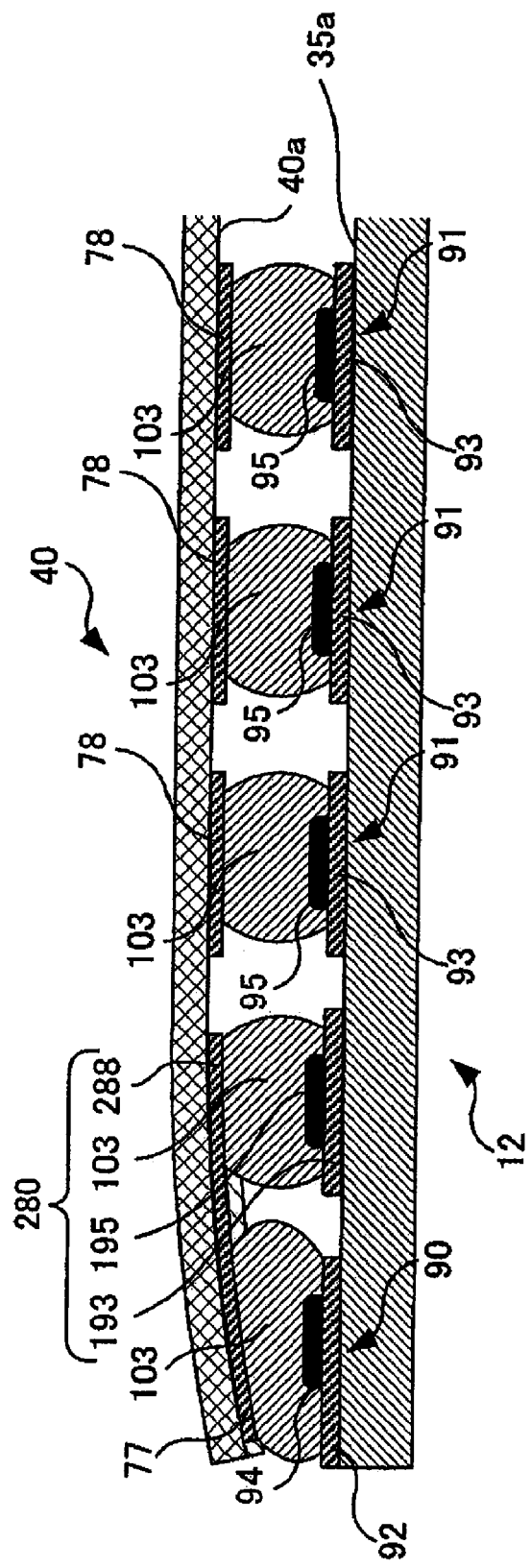
FIG. 12 is a partial sectional view along line XII-XII, showing a state of connection between the FPC and the piezoelectric actuator that are shown in FIGS. 11A and 11B, respectively.

FIGS. 11A, 11B, and 12 show a second modification. In this modification, the dummy electrodes 88 shown in FIG. 10 are made in one piece with the bond electrodes 77. As shown in FIG. 12, a reinforcement 280 of this modification is made up of a dummy electrode 288, the solder 103, the surface electrode 193, and the bond terminal 195.

FIG. 11A shows a portion of the piezoelectric actuator 12 (corresponding to its back near corner in FIG. 1) to be connected to a tip of the FPC 40, i.e., an end of the FPC 40 in a direction opposite to a direction where the FPC 40 is drawn from the piezoelectric actuator 12. FIG. 11A depicts only a portion of the piezoelectric actuator 12 corresponding to one end in the Y direction of the tip of the FPC 40, but a portion corresponding to the other end has the similar configuration as this in a symmetrical pattern. On the terminal-formed face 35*a* of the piezoelectric actuator 12, the external terminals 90 associated with the common electrodes are formed only along the outer edges of the terminal-formed face 35*a* extending in the X direction. The external terminals 91 associated with the individual electrodes are formed between the external terminals 90. Further, the surface electrodes 193 and the bond terminals 195 of the first modification (see FIG. 10) are formed on the terminal-formed face 35*a* so as to be located in regions between each external terminal 90 and each row of the external terminals 91 in the same pattern as those of the surface electrodes 93 and the bond terminals 95 of the external terminals 91, respectively. The external terminal 90 formed along the Y direction (see FIG. 4) and the second common bond electrode 77-2 (see FIG. 8A) are omitted in this modification. A terminal formed by a combination of the surface electrodes 193 and the bond terminals 195 may be positioned to correspond to a pressure chamber that does not contributes to ink ejection and are positioned at an end of a pressure chamber row or to an extension of the pressure chamber row where no pressure chamber is provided.

FIG. 11B shows a portion of the FPC 40 to be connected to the end of the piezoelectric actuator 12 shown in FIG. 11A and represents an upper face of the FPC 40, i.e., a face opposite to the electrode-formed face 40*a*. Thus, electrodes and solders formed on the electrode-formed face 40*a* of the FPC 40 are illustrated with dash lines. As shown in FIG. 11B, on the electrode-formed face of the FPC 40, the dummy electrode 288 is formed, in proximity to an end of the row-group 78-1 extending along the Y direction (see FIG. BA), so as to be continuously integrated with the first common bond electrode 77-1. Solders 103 are applied onto the dummy electrode 288 at positions corresponding to the bond terminals 195 (see FIG. 11A). In a region between the end of the row-group 78-2 (see FIG. 8A), which is placed downstream of the row-group 78-1 with respect to the direction where the FPC 40 is drawn from the piezoelectric actuator 12, and the first common bond electrode 77-1, no solder is applied even at positions confronting the bond terminals 195. The region is used for leading the wirings 79 which are respectively connected to the bond electrodes 78 included in the row-group 78-1.

The second modification provides the same advantages as that of the first modification.

Figure 13:
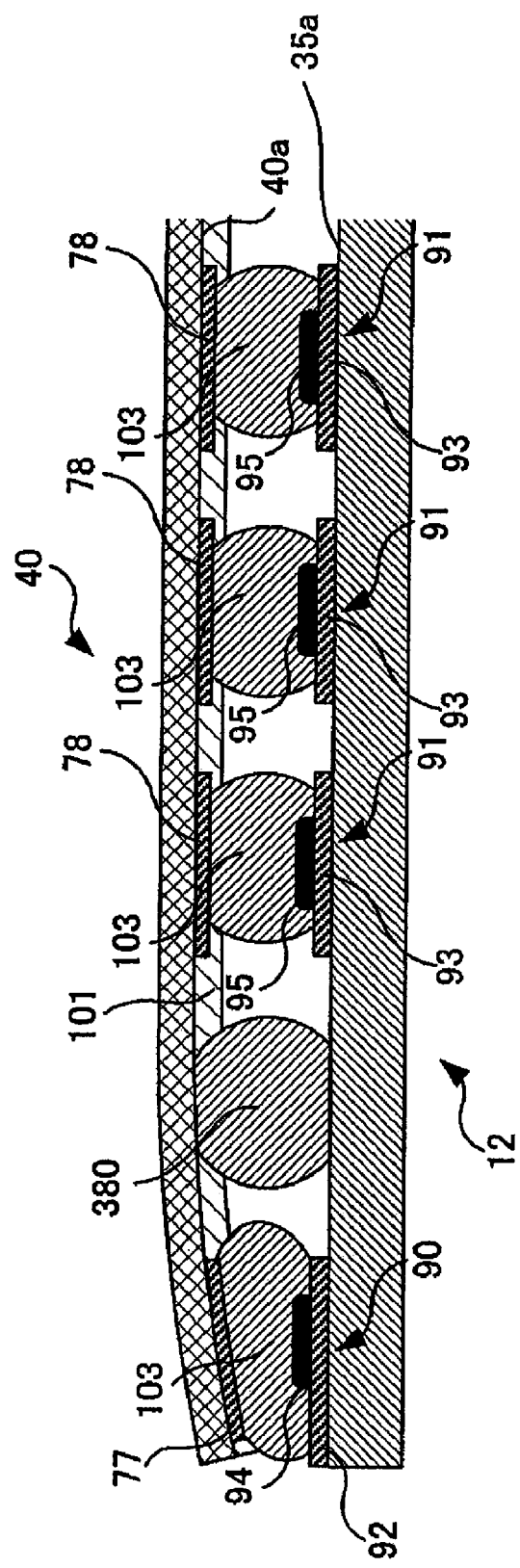
FIG. 13 is a partial sectional view showing a state of connection between an FPC and a piezoelectric actuator that are included in an ink-jet head according to a third modification.

FIG. 13 shows a third modification. A reinforcement 380 of this modification is made of a thermo-melting resin or preferably a thermo-melting adhesive. It is preferable that a melting point of the thermo-melting resin or the thermo-melting adhesive is substantially the same as that of the solder. Heating for connecting the FPC 40 to the piezoelectric actuator 12 causes the solders 103 and the reinforcements 380 to be melted together, and thus the piezoelectric actuator 12 and the FPC 40 are connected. In this modification, like in the above-described embodiment, there can be obtained the effect that the piezoelectric actuator 12 and the FPC 40 can be spaced at a uniform distance, and that the FPC 40 cannot easily be distorted so that accurate connection between the bond terminals and the bond electrodes are realized. Preferably, the reinforcement 380 connects the piezoelectric actuator 12 and the FPC 40 with substantially same bond strength as the solder 103 does.

The reinforcement may not necessarily be bonded to the terminal-formed face 35*a* of the piezoelectric actuator 12 and to the electrode-formed face 40*a* of the FPC 40, as long as the reinforcement is in contact with and interposed between the faces 35*a* and 40*a*.

In the above embodiment, the external terminals 91 associated with the individual electrodes are arranged to form groups, and the external terminals 90 associated with the common electrodes are disposed closer to the outer edge of the terminal-formed face 35*a* than the groups of the external terminals 91 are. However, arrangement of the external terminals 90 and 91 is not limited thereto. For example, external terminals associated with common electrodes may be disposed between external terminals associated with individual electrodes.

A height of the reinforcement 80 may either be larger or smaller than a distance between the electrode-formed face 40a of the FPC 40 and the terminal-formed face 35a of the piezoelectric actuator 12 in a portion where the external terminal 91 and the bond electrode 78 are bonded with the solder 103.

A shape of the dummy electrode 88 may be different from the shape of the bond electrode 78 associated with the individual electrode.

The external terminals 90 associated with the common electrodes may not necessarily be formed along a part of the outer edge of the terminal-formed face 35a of the piezoelectric actuator 12.

It is not always required that the external terminal 90 has a planar area larger than that of the external terminal 91. The external terminal 90 may have a planar area equal to or smaller than that of the external terminal 91.

In the above embodiment, solders 103 are employed for connecting the bond electrodes 78 to the external terminals 91 and for connecting the bond electrodes 77 to the external terminals 90. However, this is not limitative, and a metal bond other than the solder 103, such as a conductive adhesive, may be employed instead.

The actuator is not limited to the piezoelectric-type as in the above embodiment where a pressure wave that acts as ejection energy is applied to ink in the pressure chamber 23 by driving the piezoelectric actuator 12, but may be of other type including a thermal type.

The present invention is not limited to an ink-jet head but may be applied to any other connecting structure between an FPC having an electrode-formed face on which is electrodes are formed and a terminal-formed member having a terminal-formed face on which terminals to be bonded to the respective electrodes of the flexible printed circuit are formed.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. An ink-jet head comprising:
a flexible printed circuit having an electrode-formed face on which a constant-potential-signal electrode and a plurality of drive-signal electrodes are formed, the constant-potential-signal electrode being connected to a constant-potential-signal wiring, and each of the drive-signal electrodes being connected to a drive-signal wiring
a head main body having a plurality of nozzles that eject ink, a plurality of pressure chambers that respectively communicate with the nozzles and are arranged adjacent to one another, and an energy applier that applies ejection energy to ink in the pressure chambers on the basis of a drive signal; and
a covering member formed on the flexible printed circuit board, wherein the covering member is configured to cover a first portion of the electrode-formed face and to expose each of the plurality of drive-signal electrodes and the constant-potential signal electrode, wherein:
the energy applier has a terminal-formed face on which a plurality of drive-signal terminals and a constant-potential-signal terminal are formed, each of the drive-signal terminals is supplied with a drive signal, and the constant-potential-signal terminal is supplied with a constant-potential signal;

the constant-potential-signal terminal is bonded to the constant-potential signal electrode with a metal bond, and the drive-signal terminals are respectively bonded to the drive-signal electrodes with a metal bond;
the covering member is further configured to not cover a second portion of the electrode-formed face, the second portion of the electrode-formed face being located between the plurality of drive-signal electrodes and the constant-potential-signal electrode; and
the ink-jet head further comprises a reinforcement that is located between the drive-signal terminals arranged adjacent to one another and the constant-potential-signal terminal and is in contact with and interposed between the terminal-formed face and the second portion of the electrode-formed face so that the terminal-formed face and the electrode-formed face are spaced apart from each other.

2. The ink-jet head according to claim 1, wherein:
the drive-signal terminals are arranged at predetermined intervals so as to form a group; and
the constant-potential-signal terminal is disposed closer to an outer edge of the terminal-formed face than the group of the drive-signal terminals is.

3. The ink-jet head according to claim 1, wherein a height of the reinforcement is substantially the same as a distance between the electrode-formed face and the terminal-formed face in a portion where the drive-signal terminals are respectively bonded to the drive-signal electrodes with a metal bond.

4. The ink-jet head according to claim 1, wherein the reinforcement includes a dummy electrode that is formed on the electrode-formed face to be located between the drive-signal electrodes arranged adjacent to one another and the constant-potential-signal electrode, and a metal bond that is applied to the dummy electrode.

5. The ink-jet head according to claim 4, wherein a shape and a size of the dummy electrode are substantially the same as those of the drive-signal electrode.

6. The ink-jet head according to claim 4, wherein:
the reinforcement further includes a dummy terminal that is formed on the terminal-formed face to be located between the drive-signal terminals arranged adjacent to one another and the constant-potential-signal terminal; and
the metal bond that is applied to the dummy electrode bonds the dummy electrode to the dummy terminal.

7. The ink-jet head according to claim 1, wherein the reinforcement is made of a thermo-melting resin.

8. The ink-jet head according to claim 1, wherein the constant-potential-signal terminal extends along at least a part of an outer edge of the terminal-formed face.

9. The ink-jet head according to claim 1, wherein the constant-potential-signal terminal has a planar area larger than that of the drive-signal terminal.

10. The ink-jet head according to claim 1, wherein the reinforcement fixes the terminal-formed face to the electrode-formed face so as to resist a force in a direction where the terminal-formed face and the electrode-formed face are made distant from each other.

11. The ink-jet head according to claim 1, wherein the entire perimeter of the reinforcement member is in contact with the covering member.

12. The-jet head according to claim 1, wherein the covering member comprises an electrically insulating material.

13. An ink-jet head comprising:
a flexible printed circuit having an electrode-formed face on which a constant-potential-signal electrode and a plurality of drive-signal electrodes are formed, the constant-potential-signal electrode being connected to a constant-potential-signal wiring, and each of the drive-signal electrodes being connected to a drive-signal wiring;

a passage unit having a plurality of nozzles that eject ink, and a plurality of pressure chambers that respectively communicate with the nozzles and are arranged adjacent to one another; and an actuator unit that applies ejection energy to ink in the pressure chambers on the basis of a drive signal, and has a terminal-formed face on which a plurality of drive-signal terminals and a constant-potential-signal terminal are formed, each of the drive-signal terminals is being supplied with a drive signal, the constant-potential-signal terminal being supplied with a constant-potential signal, the actuator unit including a plurality of individual electrodes respectively connected to the drive-signal terminals, a common electrode connected to the constant-potential-signal terminal, and a piezoelectric layer sandwiched between the individual electrodes and the common; and a covering member formed on the flexible printed circuit board, wherein the covering member is configured to cover a first portion of the electrode-formed face and to expose each of the plurality of drive-signal electrodes and the constant-potential signal electrode, wherein:

the constant-potential-signal terminal is bonded to the constant-potential signal electrode with a metal bond, and the drive-signal terminals are respectively bonded to the drive-signal electrodes with a metal bond the covering member is further configured to not cover a second portion of the electrode-formed face, the second portion of the electrode-formed face being located between the plurality of drive-signal electrodes and the constant-potential-signal electrode; and the ink-jet head further comprises a reinforcement that is located between the drive-signal terminals arranged adjacent to one another and the constant-potential-signal terminal and is in contact with and interposed between the terminal-formed face and the second portion of the electrode-formed face so that the terminal-formed face and the electrode-formed face are spaced apart from each other.

14. An ink-jet head comprising:

a flexible printed circuit having an electrode-formed face on which a plurality of electrodes are formed; and a head main body having a plurality of nozzles that eject ink, a plurality of pressure chambers that respectively communicate with the nozzles and are arranged adjacent to one another, and an energy applier that applies ejection energy to ink in the pressure chambers on the basis of a drive signal; and a covering member formed on the flexible printed circuit board, wherein the covering member is configured to cover a first portion of the electrode-formed face and to expose each of the plurality of electrodes, wherein:

the energy applier has a terminal-formed face on which a plurality of terminals to be bonded to the respective electrodes of the flexible printed circuit ate formed the covering member is further configured to not cover a second portion of the electrode-formed face, the second portion of the electrode-formed face being located between a first electrode of the plurality of electrodes closest to an outer edge of the electrode-formed face and a second electrode of the plurality electrodes positioned more distant from the outer edge of the electrode-formed face than the first electrode; and the ink-jet head further comprises a reinforcement that is located between a terminal closest to the outer edge of the electrode-formed face and a terminal positioned more distant from the outer edge than the terminal closest to the outer edge, and the reinforcement is in contact with and interposed between the terminal-formed face and the second portion of the electrode-formed face so that the terminal-formed face and the electrode-formed face are spaced apart from each other.

15. A connecting structure between a flexible printed circuit and a terminal-formed member, wherein:

the flexible printed circuit has an electrode-formed face on which a plurality of electrodes are formed;

the terminal-formed member has a terminal-formed face on which a plurality of terminals to be bonded to the respective electrodes of the flexible printed circuit are formed; and the connecting structure further comprises:

a covering member formed on the flexible printed circuit board, wherein the covering member is configured to cover a first portion of the electrode-formed face, to expose each of the plurality of electrodes, and to not cover a second portion of the electrode-formed face, wherein the second portion of the electrode-formed face is located between a first electrode of the plurality of electrodes closest to an outer edge of the electrode-formed face and a second electrode of the plurality electrodes positioned more distant from the outer edge of the electrode-formed face than the first electrode; and a reinforcement that is located between a terminal closest to an outer edge of the electrode-formed face of the flexible printed circuit and a terminal positioned more distant from the outer edge than the terminal closest to the outer edge, and the reinforcement is in contact with and interposed between the terminal-formed face and the second portion of the electrode-formed face so that the terminal-formed face and the electrode-formed face are spaced apart from each other.

* * * * *